United States Patent
Fuke et al.

(10) Patent No.: US 7,289,305 B2
(45) Date of Patent: Oct. 30, 2007

(54) MAGNETORESISTIVE ELEMENT, MAGNETIC HEAD, AND MAGNETIC RECORDING AND REPRODUCING APPARATUS

(75) Inventors: Hiromi Fuke, Kawasaki (JP); Hideaki Fukuzawa, Sagamihara (JP); Hiromi Yuasa, Yokohama (JP); Susumu Hashimoto, Ebina (JP); Hitoshi Iwasaki, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 420 days.

(21) Appl. No.: 11/074,643

(22) Filed: Mar. 9, 2005

(65) Prior Publication Data

US 2005/0201020 A1   Sep. 15, 2005

(30) Foreign Application Priority Data

Mar. 11, 2004   (JP) ............................. 2004-069410

(51) Int. Cl.
*G11B 5/127* (2006.01)
(52) U.S. Cl. .............................................. 360/324.12
(58) Field of Classification Search .......... 360/324.12, 360/324.1, 324.2, 324.11
See application file for complete search history.

(56) References Cited

U.S. PATENT DOCUMENTS

| | | | |
|---|---|---|---|
| 7,212,383 B2 * | 5/2007 | Hasegawa et al. | 360/324.1 |
| 7,218,483 B2 * | 5/2007 | Yuasa et al. | 360/324.1 |
| 2002/0051380 A1 | 5/2002 | Kamiguchi et al. | |
| 2004/0021990 A1 | 2/2004 | Koui et al. | |
| 2004/0190204 A1 | 9/2004 | Yoshikawa et al. | |
| 2004/0201929 A1 | 10/2004 | Hashimoto et al. | |

OTHER PUBLICATIONS

M. Takagishi, et al., "The Applicability of CPP-GMR Heads for Magnetic Recording", IEEE Transactions on Magnetics, vol. 38, No. 5, Sep. 2002, pp. 2277-2282.
Hiroyuki Hoshiya, et al., "Current-perpendicular-to-the-plane giant magnetoresistance in structures with half-metal materials laminated between CoFe layers", Journal of Applied Physics, vol. 95, No. 11, Jun. 1, 2004, pp. 6774-6776.
K. Nagasaka, et al., "Giant magnetoresistance properties of specular spin valve films in a current perpendicular to plane structure", Journal of Applied Physics, vol. 89, No. 11, Jun. 1, 2001, pp. 6943-6945.
H. Yuasa, et al., "Output enhancement of spin-valve giant magnetoresistance in current-perpendicular-to-plane geometry", Journal of Applied Physics, vol. 92, No. 5, Sep. 1, 2002, pp. 2646-2650.

* cited by examiner

*Primary Examiner*—Allen Cao
(74) *Attorney, Agent, or Firm*—Oblon, Spivak, McClelland, Maier & Neustadt, P.C.

(57) ABSTRACT

A magnetoresistive element has a magnetization pinned layer, a nonmagnetic spacer layer including a stack of a nonmagnetic metal layer, a resistance increasing layer and another nonmagnetic metal layer, a magnetization free layer having an fcc crystal structure, a cap layer having an fcc, an hcp, or a bcc crystal structure and having an interatomic distance between nearest neighbors greater than that of the magnetization free layer, and a pair of electrodes configured to provide a sense current in a direction substantially perpendicular to planes of the magnetization pinned layer, the nonmagnetic spacer layer, and the magnetization free layer.

19 Claims, 2 Drawing Sheets

MAGNETORESISTIVE ELEMENT, MAGNETIC HEAD, AND MAGNETIC RECORDING AND REPRODUCING APPARATUS

CROSS-REFERENCE TO RELATED APPLICATIONS

This application is based upon and claims the benefit of priority from prior Japanese Patent Application No. 2004-069410, filed Mar. 11, 2004, the entire contents of which are incorporated herein by reference.

BACKGROUND OF THE INVENTION

1. Field of the Invention

The present invention relates to a magnetoresistive element, a magnetic head, and a magnetic recording and reproducing apparatus, and more specifically, to a magnetoresistive element configured to conduct a sense current in a direction perpendicular to a plane of a magnetoresistive film, as well as a magnetic head and a magnetic recording and reproducing apparatus using the magnetoresistive element.

2. Description of the Related Art

In recent years, efforts have been made to reduce the sizes of magnetic recording media while increasing their capacities. Accordingly, the relative speed between a magnetic read head and a magnetic recording medium during read operation has been decreasing. Under the circumstances, expectation to magnetoresistive heads which allow high outputs under the low relative speed has been increasing.

It has been reported that a multilayered film with a sandwich structure including a ferromagnetic layer, a nonmagnetic layer and a ferromagnetic layer successfully produces a high magnetoresistive effect, if the ferromagnetic layers are not anti-ferromagnetically coupled. Specifically, the nonmagnetic layer is referred to as a "spacer layer" or an "intermediate layer", one of the ferromagnetic layer is referred to as a "pinned layer" or a "magnetization pinned layer", and the other ferromagnetic layer is referred to as a "free layer" or a "magnetization free layer". The magnetization of the pinned layer is fixed by applying an exchange biasing magnetic field. The magnetization of the free layer is reversed by an external magnetic field (or signal magnetic field). The magnetization reversal of the free layer changes the relative angle between the magnetization directions of the two ferromagnetic layers sandwiching the nonmagnetic layer between them, making it possible to produce a high magnetoresistive effect. The multilayered film of this type is called a "spin-valve".

Because the spin-valve can be saturated under a low magnetic field, it is suitable for a read head and has already been put into practical use. However, the magnetoresistive ratio of the spin-valve is limited to about 20%, and a higher magnetoresistive ratio has been required.

The spin-valve includes a CIP (Current-In-Plane) type in which a sense current is supplied in a direction parallel to the film plane and a CPP (Current-Perpendicular-to-Plane) type in which the sense current is supplied in a direction perpendicular to the film plane. The CPP type magnetoresistive element has been reported to exhibit a magnetoresistive ratio about ten times as high as that of the CIP type magnetoresistive element.

In the spin-valve structure, however, the total thickness of the spin-dependent layers is very small and the number of interfaces is also small. Accordingly, if a spin-valve with a structure employed in the conventional CIP type is supplied with a current in the direction perpendicular to the film plane, the element shows a low resistance and thus shows a low output absolute value. When such a spin-valve has a pinned layer and a free layer with a thickness of 5 nm, for example, the output absolute value $A\Delta R$ for 1 $\mu m^2$ becomes as small as about 0.5 $m\Omega$ $\mu m^2$. Thus, it is important to increase outputs in order to put a CPP type magnetoresistive element using a spin-valve film to practical use. To achieve this, it is critical to increase the resistance value of a part of the magnetoresistive element which contributes to spin-dependent conduction, and to increase the resistance change. It is also important that the pinned layer and the free layer be made of a material excellent in bulk scattering and interface scattering.

To improve the magnetoresistive (MR) effect, a technique that inserts a resistance increasing layer including an insulator into a spin-valve film has been proposed (see. J. Appl. Phys., 89, p 6943 (2001) or IEEE Trans. Magn., 38, p 2277 (2002)). The spin-valve is composed of a part where the spin-dependent scattering of electrons is caused remarkably (pinned layer/spacer layer/free layer) and a part where the spin-dependent scattering is insignificant (a buffer layer, an antiferromagnetic layer, a protective layer, and the like). Assuming that the resistance of the former part is Rsd and the resistance of the latter part is Rsi, the magnetoresistive ratio (MR ratio) of the spin-valve is expressed by the formula: $MR=\Delta Rsd/(Rsi+Rsd)$. The insertion of the resistance increasing layer including the insulator into the spin-valve film is intended to obtain improved MR ratio by making Rsd far higher than Rsi.

It has also been reported that the CPP magnetoresistive element is improved in the bulk scattering effect and the interface scattering effect by using $Fe_{50}Co_{50}$ or a stack of $[Fe_{50}Co_{50}/Cu]$ having a bcc structure as a pinned layer and a free layer (see J. Appl. Phys., 92, p 2646 (2002)).

Further, there has been reported on an attempt to improve the MR ratio by insertion of a spin filter layer of Cu having a thickness of 1 nm (see IEEE Trans. Magn., 38, p 2277 (2002)).

BRIEF SUMMARY OF THE INVENTION

The spin-valve film is a multilayered film in which many thin films are stacked. An orientation plane of the spin-valve film often becomes a (111) plane for face-centered cubic (fcc) and face-centered tetragonal (fct) structures, a (110) plane for a body-centered cubic (bcc) structure, or a (011) plane for a hexagonal close-packed (hcp) structure. A typical example of the spin-valve film includes an antiferromagnetic layer of PtMn or IrMn, a synthetic pinned layer with a three-layered structure of CoFe/Ru/CoFe, a non-magnetic spacer layer of Cu, and a free layer of CoFe or a CoFe/NiFe stack. Table 1 shows the crystal structure, the lattice constant, and the interatomic distance between nearest neighbors in the (111) plane for the above materials.

TABLE 1

Interatomic distance between nearest neighbors in (111) plane for typical materials of spin-valve film

| | Crystal structure | Lattice constant | Interatomic distance between nearest neighbors in (111) plane |
|---|---|---|---|
| IrMn | fcc | a = 3.78 Å | 2.67 Å |

TABLE 1-continued

Interatomic distance between nearest neighbors in
(111) plane for typical materials of spin-valve film

| | Crystal structure | Lattice constant | Interatomic distance between nearest neighbors in (111) plane |
|---|---|---|---|
| PtMn | fct*[1] | a = 3.971 A<br>c = 3.696 A | 2.712 A |
| CoFe | fcc | a = 3.5472 A | 2.508 A |
| NiFe*[2] | fcc | a = 3.5235 A | 2.491 A |
| Cu | fcc | a = 3.61496 A | 2.556 A |
| Fe | bcc | a = 2.866 A | 2.482 A |

*[1]The crystal structure of PtMn is fcc in the case of an as-deposited film.
*[2]Values for Ni are used.

Table 1 indicates that, in the spin-valve film having the structure described above, the antiferromagnetic layer has the largest in-plane interatomic distance between nearest neighbors. Further, in the spin-valve film having the structure described above, the antiferromagnetic layer is thickest. Because a thick layer has high lattice stability, the lattice constant thereof is assumed to exert a strong effect on other layers. The antiferromagnetic layer has a large interatomic distance between nearest neighbors and thus widens the lattice of Cu, the nonmagnetic spacer layer, and that of CoFe, the free layer. In the spin-valve film, crystal grains of an upper layer are epitaxially grown on crystal grains of a lower layer. Accordingly, tensile stress or compression stress may act between adjacent two layers, so that the spin-valve film as a whole may be distorted and become unstable. The distortion may facilitate occurrence of interfacial irregularity, degrade orientation, and result in crystal defects. Such degraded crystallinity may affect the MR ratio of the CPP-GMR in terms of the three points described below.

A first point is the sharpness of the interfaces between the pinned layer and the spacer layer and the free layer. These interfaces contribute to the MR ratio through "spin-dependent interface scattering". However, if the sharpness of the interfaces is degraded by the influence of interfacial mixing and interfacial irregularity, a spin-independent interfacial resistance may increase, resulting in degradation of the spin-dependent interface scattering component, which reduces the MR ratio. A second point is the crystal orientation inside the pinned layer and the free layer. The pinned layer and the free layer, each formed of a ferromagnetic material, contribute to the MR ratio through "spin-dependent bulk scattering" inside thereof. However, if the crystal orientation is degraded, the spin-dependent scattering component is degraded and thus the MR ratio is reduced. A third point is the crystal orientation of the spacer layer. If defects in the spacer layer are increased, the spin diffusion length of electrons (the distance at which spins of electrons are reversed) may be reduced, resulting in reduction of the MR ratio. Thus, the instability of the crystal should be minimized.

A magnetoresistive element according to an aspect of the present invention comprises: a magnetization pinned layer including a magnetic film a magnetization direction of which is substantially pinned in one direction; a nonmagnetic spacer layer formed on the magnetization pinned layer; a magnetization free layer, formed on the nonmagnetic spacer layer, including a magnetic film having a bcc crystal structure a magnetization direction of which is varied depending on an external magnetic field; a cap layer, formed on or above the magnetization free layer, having an fcc, an hcp or a bcc crystal structure and having an interatomic distance between nearest neighbors greater than that of the magnetization free layer; and a pair of electrodes configured to provide a sense current in a direction substantially perpendicular to planes of the magnetization pinned layer, the nonmagnetic spacer layer, and the magnetization free layer.

A magnetoresistive element according to another aspect of the present invention comprises: a magnetization pinned layer including a magnetic film a magnetization direction of which is substantially pinned in one direction; a nonmagnetic spacer layer of a nonmagnetic metal formed on the magnetization pinned layer; a magnetization free layer, formed on the nonmagnetic spacer layer, including a magnetic film having an fcc crystal structure a magnetization direction of which is varied depending on an external magnetic field; a cap layer, formed on or above the magnetization free layer, having a bcc crystal structure and having an interatomic distance between nearest neighbors greater than that of the magnetization free layer; and a pair of electrodes configured to provide supply a sense current in a direction substantially perpendicular to planes of the magnetization pinned layer, the nonmagnetic spacer layer, and the magnetization free layer.

A magnetoresistive element according to still another aspect of the present invention comprises: a magnetization pinned layer including a magnetic film a magnetization direction of which is substantially pinned in one direction; a nonmagnetic spacer layer, formed on the magnetization pinned layer, including a stack of a nonmagnetic metal layer, a resistance increasing layer, and another nonmagnetic metal layer; a magnetization free layer, formed on the nonmagnetic spacer layer, including a magnetic film having an fcc crystal structure a magnetization direction of which is varied depending on an external magnetic field; a cap layer, formed on or above the magnetization free layer, having an fcc, an hcp, or a bcc crystal structure and having an interatomic distance between nearest neighbors greater than that of the magnetization free layer; and a pair of electrodes configured to provide a sense current in a direction substantially perpendicular to planes of the magnetization pinned layer, the nonmagnetic spacer layer, and the magnetization free layer.

BRIEF DESCRIPTION OF THE SEVERAL
VIEWS OF THE DRAWING

Figure 1:
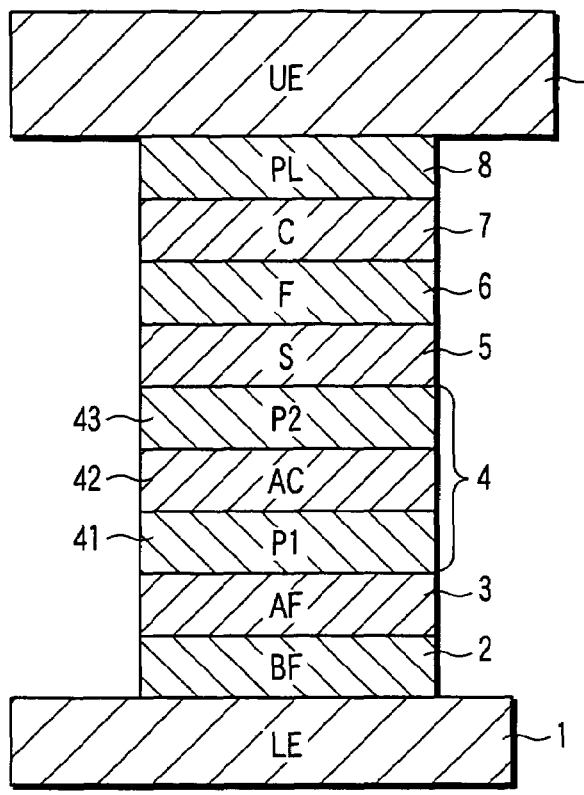
FIG. 1 is a sectional view of a magnetoresistive element according to Example 1 of the present invention.

DETAILED DESCRIPTION OF THE
INVENTION

A magnetoresistive element according to the present invention comprises a magnetization pinned layer including a magnetic film a magnetization direction of which is substantially pinned in one direction, a nonmagnetic spacer layer formed on the magnetization pinned layer, a magnetization free layer, formed on the nonmagnetic spacer layer, including another magnetic film a magnetization direction of which is varied depending on an external magnetic field, and a cap layer formed on or above the magnetization free layer.

Further, a pair of electrodes is provided to supply a sense current in a direction substantially perpendicular to the planes of the magnetization pinned layer, the nonmagnetic spacer layer, and the magnetization free layer.

The magnetization pinned layer (pinned layer) includes a single pinned layer of CoFe or FeCo, and a synthetic pinned layer having a three-layered structure such as CoFe/Ru/CoFe, FeCo/Ru/CoFe and FeCo/Ru/FeCo. A resistance increasing layer may be provided in the pinned layer. Further, the ferromagnetic layer in the single pinned layer or the synthetic pinned layer may have a stacked structure of different ferromagnetic layers, a stacked structure of a ferromagnetic layer and a nonmagnetic layer, or a stacked structure of a stack of different ferromagnetic layers and a nonmagnetic layer. For example, the synthetic pinned layer may have such a stacked structure as Cofe/Ru/FeCo/Cu/FeCo/Cu/FeCO or CoFe/Ru/CoFe/FeCo/Cu/FeCo/Cu/FeCo. To fix the magnetization of the pinned layer, an antiferromagnetic layer is generally provided adjacent to the pinned layer. The antiferromagnetic layer includes a Mn alloy represented by XMn (X is selected from a group consisting of Ir, Ru, Rh, Pt, Pd, and Re).

The nonmagnetic spacer layer includes a single layer of a nonmagnetic metal such as Cu, and a three-layered structure of a nonmagnetic metal layer, a resistance increasing layer and a nonmagnetic metal layer. Alternatively, the nonmagnetic spacer layer may be a two-layered structure of a nonmagnetic metal layer and a resistance increasing layer or may only be a resistance increasing layer.

The magnetization free layer (free layer) includes FeCo with a bcc structure, or CoFe or a stack of CoFe/NiFe with an fcc structure. A resistance increasing layer may be provided in the free layer.

In the embodiments of the present invention, a cap layer having an interatomic distance between nearest neighbors greater than that of the free layer is provided on the free layer. The cap layer may have an fcc structure, a hcp structure, a bcc structure, or another structure.

Tables 2 to 4 enumerate elements with any crystal structure described above which forms a cap layer provided on the free layer and having an in-plane interatomic distance between nearest neighbors greater than that of the free layer. These tables show the interatomic distance between nearest neighbors in the (111) plane for the elements with the fcc structure, that in the (001) plane for the elements with the hcp structure, and that in the (110) plane for the elements with the bcc structure.

TABLE 2

Interatomic distance between nearest neighbors in (111) or (001) plane for materials having an fcc or hcp structure

| Element | Crystal structure | Lattice constant | Interatomic distance between nearest neighbors in (111) or (001) plane |
|---|---|---|---|
| Ti | hcp | a = 2.92 A, c = 4.67 A | 2.92 A |
| Zr | hcp | a = 3.23, c = 5.14 A | 3.23 A |
| Hf | hcp | a = 3.32 A, c = 5.46 A | 3.32 A |
| Tc | hcp | a = 2.741 A, c = 4.398 A | 2.741 A |
| Re | hcp | a = 2.7608 A, c = 4.4582 A | 2.7608 A |
| Ru | hcp | a = 2.7039 A, c = 4.2817 A | 2.7039 A |
| Os | hcp | a = 2.7352 A, c = 4.3190 A | 2.7352 A |
| Rh | fcc | a = 3.71559 A | 2.63 A |
| Ir | fcc | a = 3.8394 A | 2.715 A |
| Pd | fcc | a = 3.8898 A | 2.751 A |
| Pt | fcc | a = 3.9231 A | 2.77 A |

TABLE 2-continued

Interatomic distance between nearest neighbors in (111) or (001) plane for materials having an fcc or hcp structure

| Element | Crystal structure | Lattice constant | Interatomic distance between nearest neighbors in (111) or (001) plane |
|---|---|---|---|
| Cu | fcc | a = 3.61496 A | 2.556 A |
| Ag | fcc | a = 4.0862 A | 2.889 A |
| Au | fcc | a = 4.07864 A | 2.884 A |
| Zn | hcp | a = 2.6649 A, c = 4.9468 A | 2.6649 A |
| Cd | hcp | a = 2.9763 A, c = 5.6181 A | 2.9763 A |
| Al | fcc | a = 4.04934 A | 2.863 A |
| Tl | hcp | a = 3.456 A, c = 5.525 A | 3.456 A |
| Pb | fcc | a = 4.9505 A | 3.501 A |

TABLE 3

Interatomic distance between nearest neighbors in (110) plane for materials having an bcc structure

| Element | Crystal structure | Lattice constant | Interatomic distance between nearest neighbors in (110) plane |
|---|---|---|---|
| Cr | bcc | a = 2.8839 A | 2.498 A |
| Mo | bcc | a = 3.1473 A | 2.726 A |
| W | bcc | a = 3.165 A | 2.741 A |
| Nb | bcc | a = 3.3004 A | 2.858 A |
| V | bcc | a = 3.0282 A | 2.622 A |

TABLE 4

Interatomic distance between nearest neighbors for materials having another structure

| Element | Crystal structure | Lattice constant | Interatomic distance between nearest neighbors |
|---|---|---|---|
| Sn | Body-centered lattice (White tin) Gray tin | a = 5.831 A, c = 3.181 A | 3.016 A 2.80 A |
| In | | a = 4.588 A, c = 4.938 A | |
| Bi | | | 3.095 A, 3.47 A |
| Sb | | | 2.90 A, 3.36 A |

More specifically, the cap layer according to the embodiments of the present invention is formed of at least one element selected from the group consisting of Zr, Hf, Tc, Re, Ru, Os, Rh, Ir, Pd, Pt, Ag, Au, Zn, Cd, Al, Tl, Pb, Cr, Mo, W, Nb, V, Sn, In, Bi, and Sb. The cap layer may be a single layer of any of these elements, or a stacked layer of two or more of these elements, or an alloy layer including two or more of these elements.

In the embodiments of the present invention, the nonmagnetic spacer layer, the free layer, and the cap layer are selected according to the following combinations. (1) When a free layer with a bcc structure is formed on a nonmagnetic spacer layer, the cap layer may have any of fcc, hcp and bcc crystal structures. In this case, the free layer may be a single layer of a nonmagnetic metal layer; a three-layered structure of a nonmagnetic metal layer, a resistance increasing layer and a nonmagnetic metal layer; a two-layered structure of a nonmagnetic metal layer and a resistance increasing layer;

or a single layer of a resistance increasing layer. (2) When a free layer with an fcc structure is formed on a nonmagnetic spacer layer formed of a nonmagnetic metal only, a cap layer with a bcc structure is provided. (3) When a free layer with an fcc structure is formed on a nonmagnetic spacer layer having a three-layered structure of a nonmagnetic metal layer, a resistance increasing layer and a nonmagnetic metal layer, or a two-layered structure of a nonmagnetic metal layer and a resistance increasing layer or a single layer of a resistance increasing layer, the cap layer may have any of fcc, hcp and bcc crystal structures.

In the embodiments of the present invention, the thickness of the cap layer is set to such an appropriate range that an effect of relaxing distortion is provided and decrease in MR ratio caused by shunting is prevented. The thickness of the cap layer is preferably ranging from 1 nm to 30 nm.

If a spin filter layer formed of Cu, for example, is provided adjacent to the free layer, the cap layer is formed of a material having an interatomic distance between nearest neighbors greater than that in the Cu (111) plane. A protective layer formed of Ta or Ti may be provided on the cap layer.

Examples of the present invention will be described with reference to the drawings.

EXAMPLE 1

FIG. 1 is a sectional view of a magnetoresistive element according to the present Example. The magnetoresistive element (spin-valve) in FIG. 1 has a structure in which the following layers are stacked: a lower electrode (LE) 1, a buffer layer (BF) 2, an antiferromagnetic layer (AF) 3, a pinned layer 4 [a first pinned layer (P1) 41, an anti-parallel coupling layer (AC) 42, and a second pinned layer (P2) 43], a spacer layer (S) 5, a free layer (F) 6, a cap layer (C) 7, a protective layer (PL) 8, and an upper electrode (UE) 9. In the magnetoresistive element in FIG. 1, a sense current is supplied between the lower electrode 1 and upper electrode 9 in a direction substantially perpendicular to the thickness direction of the spin-valve the film, thus a CPP-GMR element is realized.

The magnetization of the first pinned layer 41 is substantially pinned in one direction by the antiferromagnetic layer 3, and the magnetization of the second pinned layer 43 is pinned, through the anti-parallel coupling layer 42, in the direction opposite to that of the first pinned layer 41. The free layer 6 includes a ferromagnetic layer whose magnetization is varied depending on an external magnetic field. The spacer layer 5 disrupts magnetic coupling between the second pinned layer 43 and the free layer 5. The pinned layer 4 in FIG. 1 has a structure in which the first pinned layer 41, the anti-parallel coupling layer 42, and the second pinned layer 43 are stacked (synthetic pinned layer). However, the pinned layer may be formed of a single layer.

In the present Example, a magnetoresistive element having the structure shown in FIG. 1 was fabricated using the materials listed below.
Buffer layer 2: NiFeCr 3.2 nm/NiFe 0.8 nm,
Antiferromagnetic layer 3: PtMn 14 nm,
First pinned layer 41: $Co_{90}Fe_{10}$ 3 nm,
Anti-parallel coupling layer 42: Ru 1 nm,
Second pinned layer 43: $Fe_{50}Co_{50}$ 3 nm,
Spacer layer 5: Cu 3 nm,
Free layer 6: $Fe_{50}Co_{50}$, with a bcc structure, 3 nm,
Cap layer 7: a material selected from Table 5,
Protective layer 8: Ta 5 nm.

Table 5 shows materials used for the cap layer and the MR values of the CPP-GMR elements fabricated using the respective cap layers.

As seen in Table 5, compared to the CPP-GMR element without a cap layer, each CPP-GMR element having a cap layer on the free layer with the bcc structure exhibited an improved MR value in any case where the cap layer was formed of Ru (hcp structure), Ru (hcp structure)/Au (fcc structure), Cr (bcc structure), or W (bcc structure)/Nb (bcc structure).

TABLE 5

| Materials for the cap layer used in Example 1 | |
|---|---|
| Cap layer | MR |
| None | 0.8% |
| Ru (2 nm) | 1.25% |
| Ru (2 nm)/Au (1 nm) | 1.1% |
| Cr (1.5 nm) | 1.2% |
| W (2 nm)/Nb (0.5 nm) | 1.15% |

It should be noted that a CPP-GMR element having a cap layer formed of a single layer or a stacked layer of any of the other elements listed in Tables 2, 3 and 4 also exhibits an improved MR value.

EXAMPLE 2

In the present Example, a magnetoresistive element having the structure shown in FIG. 1 was fabricated using the materials listed below.
Buffer layer 2: NiFeCr 4.1 nm,
Antiferromagnetic layer 3: PtMn 15 nm,
First pinned layer 41: $Co_{90}Fe_{10}$ 3 nm,
Anti-parallel coupling layer 42: Ru 1 nm,
Second pinned layer 43: $Co_{90}Fe_{10}$ 3 nm,
Spacer layer 5: Cu 3 nm,
Free layer 6: $Co_{50}Fe_{50}$ 1 nm/$Ni_{80}Fe_{20}$ 3.5 nm, with an fcc structure (stacked free layer),
Cap layer 7: a material selected from Table 6,
Protective layer 8: Ta 5 nm.

Table 6 shows materials used for the cap layer and the MR values of the CPP-GMR elements fabricated using the respective cap layers.

As seen in Table 6, compared to the CPP-GMR element without a cap layer, each CPP-GMR element having a cap layer on the free layer with the fcc structure exhibited an improved MR value in any case where the cap layer was formed of Cr (bcc structure) or Cr (bcc structure)/Mo (bcc structure).

TABLE 6

| Materials for the cap layer used in Example 2 | |
|---|---|
| Cap layer | MR |
| None | 0.4% |
| Cr (2 nm) | 0.8% |
| Cr (2 nm)/Mo (2 nm) | 0.7% |

It should be noted that a CPP-GMR element having a cap layer formed of a single layer or a stacked layer of any of the other elements listed in Table 3 also exhibits an improved MR value.

EXAMPLE 3

Figure 2:
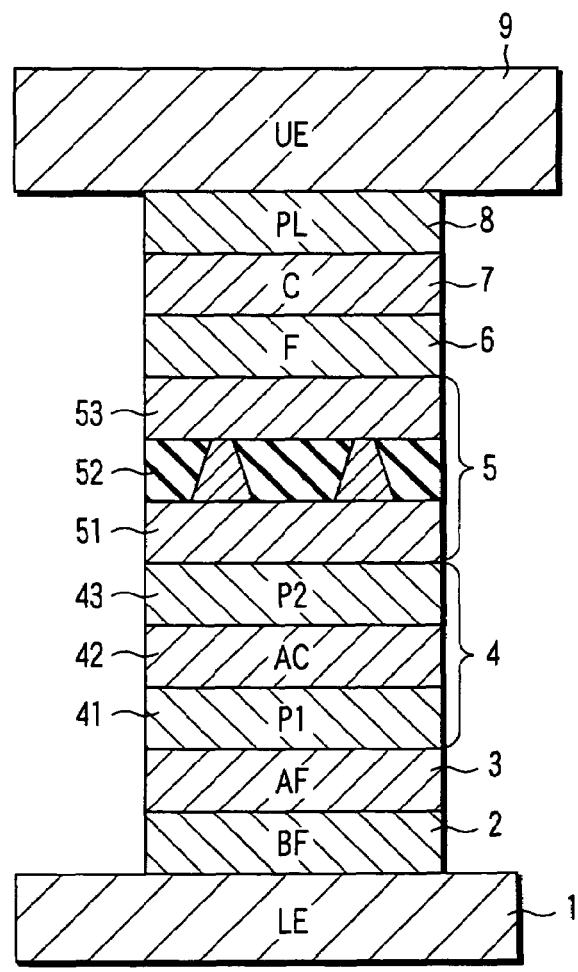
FIG. 2 is a sectional view of a magnetoresistive element according to Example 3 of the present invention.

FIG. 2 is a sectional view of the magnetoresistive element according to the present Example.

The magnetoresistive element (spin-valve) in FIG. 2 has a structure in which the following layers are stacked: the lower electrode (LE) 1, the buffer layer (BF) 2, the antiferromagnetic layer (AF) 3, the pinned layer 4 [the first pinned layer (P1) 41, the anti-parallel coupling layer (AC) 42, and a second pinned layer (P2) 43], the spacer layer (S) 5 [the first metal layer 51, the resistance increasing layer 52, and the second metal layer 53], the free layer (F) 6, the cap layer (C) 7, the protective layer (PL) 8, and the upper electrode (UE) 9. The magnetoresistive element in FIG. 2 is different from one shown in FIG. 1 in that the spacer layer 5 has a structure in which the first metal layer 51, the resistance increasing layer 52, and the second metal layer 53 are stacked. The resistance increasing layer 52 includes an insulating layer and metal paths penetrating the insulating layer. In the magnetoresistive element in FIG. 2, a sense current is supplied between the lower electrode 1 and upper electrode 9 in a direction substantially perpendicular to the thickness direction of the spin-valve film, thus a CPP-GMR element is realized. In this case, the resistance increasing layer 52 increases the resistance of the spin-valve film, and the conduction of the sense current in the direction perpendicular to the film plane is achieved through the metal paths.

In the present Example, a magnetoresistive element having the structure shown in FIG. 2 was fabricated using the materials listed below.

Buffer layer 2: Ta 3 nm/Ru 2 nm,
Antiferromagnetic layer 3: PtMn 15 nm,
First pinned layer 41: $Co_{90}Fe_{10}$ 3 nm,
Anti-parallel coupling layer 42: Ru 1 nm,
Second pinned layer 43: $Co_{90}Fe_{10}$ 3 nm,
First metal layer 51: Cu 0.2 nm,
Resistance increasing layer 52: Al—O (alumina) 1.5 nm, including metal paths of Cu,
Second metal layer 53: Cu 0.5 nm,
Free layer 6: $Co_{90}Fe_{10}$ 1 nm/$Ni_{80}Fe_{20}$ 3.5 nm, with an fcc structure (stacked free layer),
Cap layer 7: a material selected from Table 7,
Protective layer 8: Ta 5 nm.

Table 7 shows materials used for the cap layer and the MR values of the CPP-GMR elements fabricated using the respective cap layers.

As seen in Table 7, compared to the CPP-GMR element without a cap layer, each CPP-GMR element having a cap layer on the free layer with the bcc structure formed on a spacer layer of the first metal layer, the resistance increasing layer and the second metal layer exhibited an improved MR value in any case where the cap layer was formed of Ru (hcp structure), Ru (hcp structure)/Au (fcc structure), Cr (bcc structure), W (bcc structure)/Nb (bcc structure), Rh (fcc structure)/Cr (bcc structure), or Ir (fcc structure)/Rh (fcc structure).

TABLE 7

Materials for the cap layer used in Example 3

| Cap layer | MR |
| --- | --- |
| None | 3.5% |
| Ru (2 nm) | 4.5% |
| Ru (2 nm)/Au (1 nm) | 4.7% |
| Cr (1.5 nm) | 4.3% |
| W (2 nm)/Nb (0.5 nm) | 4.4% |
| Rh (1.5 nm)/Cr (1 nm) | 4.3% |
| Ir (2.5 nm) | 4.3% |
| Rh (3 nm) | 4.6% |

It should be noted that a CPP-GMR element having a cap layer formed of a single layer or a stacked layer of any of the other elements listed in Tables 2, 3 and 4 also exhibits an improved MR value.

Other Embodiments

Now, a magnetic recording and reproducing apparatus provided with the magnetoresistive element according to the present invention will be described. The magnetoresistive element shown in FIG. 1 or 2 may be incorporated into the integrated read/write head assembly, for example, in the magnetic recording and reproducing apparatus.

Figure 3:
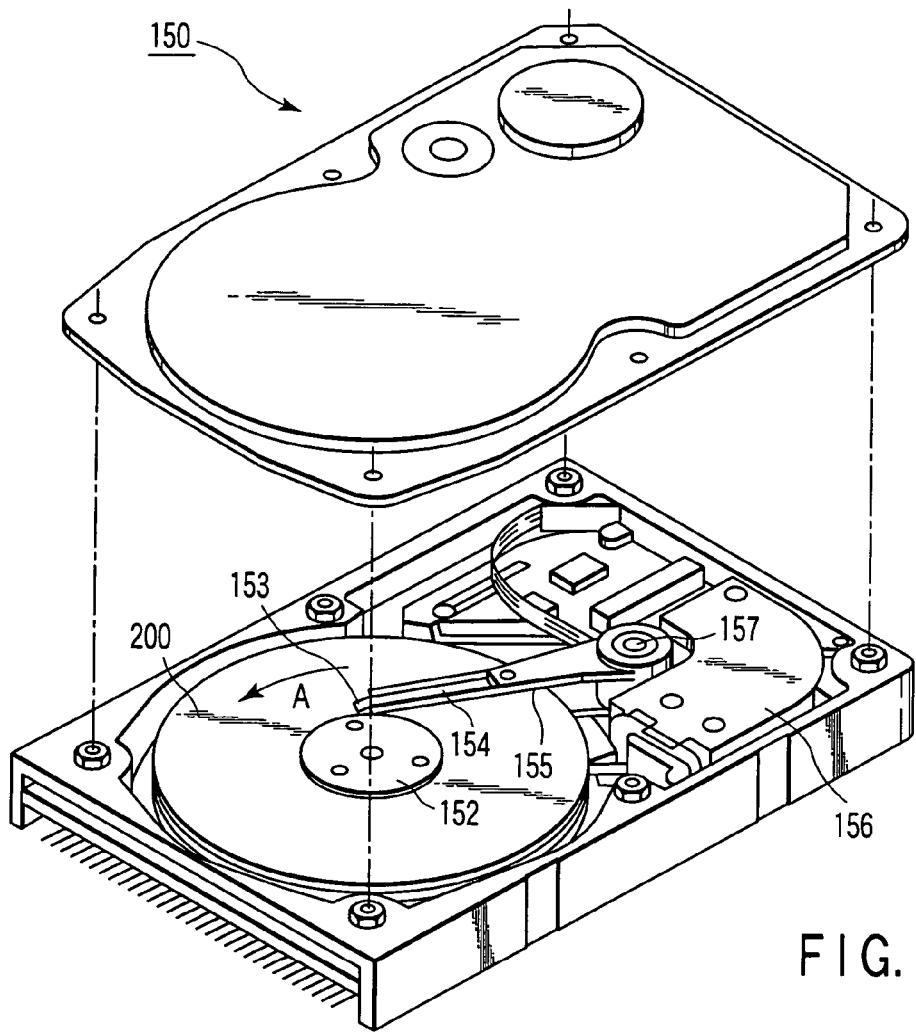
FIG. 3 is a perspective view showing a configuration of a magnetic recording and reproducing apparatus according to the present invention.

FIG. 3 is a perspective view showing a structure of a magnetic recording and reproducing apparatus. The magnetic recording and reproducing apparatus 150 uses a rotary actuator. In this figure, a recording disk 200 is mounted on a spindle 152, and is rotated in the direction of the arrow A by a motor (not shown) which responds to control signals from a control unit of a drive controller (not shown). The magnetic recording and reproducing apparatus 150 may comprise a plurality of disks 200.

A head slider 153 for writing information to and reading information from the disk 200 is mounted on the distal end of a suspension 154. The head slider 153 has a magnetic head comprising the magnetoresistive element according to any of the above embodiments.

When the disk 200 is rotated, the air-bearing surface (ABS) of the header slider 153 is kept at a predetermined flying height from the surface of the disk 200. Alternatively, the slider may be in contact with the medium disk 200, which is known as "in-contact type".

The suspension 154 is connected to one end of an actuator arm 155 having a bobbin for holding a driving coil (not shown). A voice coil motor 156, a type of a linear motor, is disposed at the other end of the actuator arm 155. The voice coil motor 156 is composed of a driving coil (not shown) wound around the bobbin and a magnetic circuit including a permanent magnet and an opposite yoke disposed to sandwich the coil.

The actuator arm 155 is held by ball bearings (not shown) disposed at upper and lower positions of a pivot 157, and is actuated by the voice coil motor 156.

Figure 4:
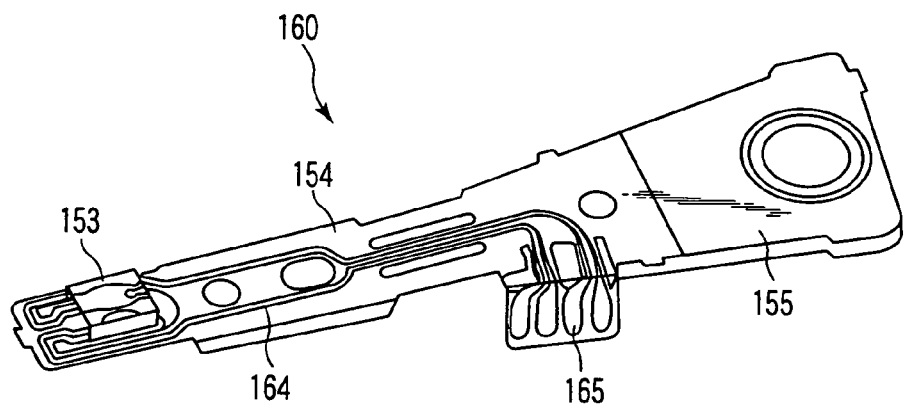
FIG. 4 is a perspective view of a magnetic head assembly according to the present invention.

FIG. 4 is a magnified perspective view of the distal end of the magnetic head assembly including the actuator arm 155 viewed from the disk. The magnetic head assembly 160 includes the actuator arm 155 and the suspension 154 connected to one end of the actuator arm 155.

A head slider 153 is attached to a tip of the suspension 154; the head slider 153 comprises a magnetic head including the magnetoresistive element shown in FIG. 1 or 2. The suspension 154 has lead wires 164 for writing and reading signals, and the lead wires 164 are connected to electrodes of the magnetic head assembled in the head slider 153. Reference numeral 165 in the figure denotes electrode pads of the magnetic head assembly 160.

The magnetic recording and reproducing apparatus according to the embodiment of the present invention, provided with the magnetoresistive element shown in FIG. 1 or 2, can read magnetic information recorded in the disk 200 at a recording density higher than that achieved with the prior art.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive element comprising:
   a magnetization pinned layer including a magnetic film a magnetization direction of which is substantially pinned in one direction;
   a nonmagnetic spacer layer formed on the magnetization pinned layer;
   a magnetization free layer, formed on the nonmagnetic spacer layer, including a magnetic film having a bcc crystal structure a magnetization direction of which is varied depending on an external magnetic field;
   a cap layer, formed on or above the magnetization free layer, having an fcc, an hcp or a bcc crystal structure and having an interatomic distance between nearest neighbors greater than that of the magnetization free layer; and
   a pair of electrodes configured to provide a sense current in a direction substantially perpendicular to planes of the magnetization pinned layer, the nonmagnetic spacer layer, and the magnetization free layer.

2. The magnetoresistive element according to claim 1, wherein the cap layer is formed of at least one selected from the group consisting of Zr, Hf, Tc, Re, Ru, Os, Rh, Ir, Pd, Pt, Ag, Au, Zn, Cd, Al, Tl, Pb, Cr, Mo, W, Nb, V, Sn, In, Bi, and Sb.

3. The magnetoresistive element according to claim 1, wherein the cap layer has a thickness ranging from 1 nm to 30 nm.

4. The magnetoresistive element according to claim 1, wherein the nonmagnetic spacer layer is formed of a nonmagnetic metal.

5. The magnetoresistive element according to claim 1, wherein the nonmagnetic spacer layer includes a stack of a nonmagnetic metal layer, a resistance increasing layer, and another nonmagnetic metal layer.

6. The magnetoresistive element according to claim 5, wherein the resistance increasing layer includes an insulating layer and metal paths penetrating the insulating layer and contacting the magnetization pinned layer and the magnetization free layer.

7. The magnetoresistive element according to claim 6, wherein the insulating layer includes alumina and the metal paths include Cu.

8. The magnetoresistive element according to claim 6, wherein substantial part of the sense current flows through the metal paths.

9. A magnetoresistive element comprising:
   a magnetization pinned layer including a magnetic film a magnetization direction of which is substantially pinned in one direction;
   a nonmagnetic spacer layer of a nonmagnetic metal formed on the magnetization pinned layer;
   a magnetization free layer, formed on the nonmagnetic spacer layer, including a magnetic film having an fcc crystal structure a magnetization direction of which is varied depending on an external magnetic field;
   a cap layer, formed on or above the magnetization free layer, having a bcc crystal structure and having an interatomic distance between nearest neighbors greater than that of the magnetization free layer; and
   a pair of electrodes configured to provide a sense current in a direction substantially perpendicular to planes of the magnetization pinned layer, the nonmagnetic spacer layer, and the magnetization free layer.

10. The magnetoresistive element according to claim 9, wherein the cap layer is formed of at least one selected from the group consisting of Cr, Mo, W, Nb, and V.

11. The magnetoresistive element according to claim 9, wherein the cap layer has a thickness ranging from 1 nm to 30 nm.

12. A magnetoresistive element comprising:
    a magnetization pinned layer including a magnetic film a magnetization direction of which is substantially pinned in one direction;
    a nonmagnetic spacer layer, formed on the magnetization pinned layer, including a stack of a nonmagnetic metal layer, a resistance increasing layer, and another nonmagnetic metal layer;
    a magnetization free layer, formed on the nonmagnetic spacer layer, including a magnetic film having an fcc crystal structure a magnetization direction of which is varied depending on an external magnetic field;
    a cap layer, formed on or above the magnetization free layer, having an fcc, an hcp, or a bcc crystal structure and having an interatomic distance between nearest neighbors greater than that of the magnetization free layer; and
    a pair of electrodes configured to provide a sense current in a direction substantially perpendicular to planes of the magnetization pinned layer, the nonmagnetic spacer layer, and the magnetization free layer.

13. The magnetoresistive element according to claim 12, wherein the cap layer is formed of at least one selected from the group consisting of Zr, Hf, Tc, Re, Ru, Os, Rh, Ir, Pd, Pt, Ag, Au, Zn, Cd, Al, Tl, Pb, Cr, Mo, W, Nb, V, Sn, In, Bi, and Sb.

14. The magnetoresistive element according to claim 12, wherein the cap layer has a thickness ranging from 1 nm to 30 nm.

15. The magnetoresistive element according to claim 12, wherein the resistance increasing layer includes an insulating layer and metal paths penetrating the insulating layer and contacting the magnetization pinned layer and the magnetization free layer.

16. The magnetoresistive element according to claim 15, wherein the insulating layer includes alumina and the metal paths include Cu.

17. The magnetoresistive element according to claim 15, wherein substantial part of the sense current flows through the metal paths.

18. A magnetic head comprising the magnetoresistive element according to claim 12.

19. A magnetic recording and reproducing apparatus comprising the magnetic head according to claim 18, and a magnetic recording medium.

* * * * *